(12) United States Patent
Kwok

(10) Patent No.: US 12,316,345 B2
(45) Date of Patent: May 27, 2025

(54) SYSTEMS AND METHODS FOR OPERATING LOW-DENSITY PARITY-CHECK BIT-FLIPPING DECODER

(71) Applicant: SK Hynix NAND Product Solutions Corp., San Jose, CA (US)

(72) Inventor: Zion Kwok, Burnaby (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 184 days.

(21) Appl. No.: 18/089,912

(22) Filed: Dec. 28, 2022

(65) Prior Publication Data
US 2024/0223213 A1 Jul. 4, 2024

(51) Int. Cl.
H03M 13/11 (2006.01)
H03M 13/00 (2006.01)

(52) U.S. Cl.
CPC ...... H03M 13/1111 (2013.01); H03M 13/611 (2013.01)

(58) Field of Classification Search
CPC ............ H03M 13/1111; H03M 13/611; H03M 13/1108
USPC ........................................................ 714/758
See application file for complete search history.

(56) References Cited

U.S. PATENT DOCUMENTS

| | | | | |
|---|---|---|---|---|
| 11,108,407 B1 * | 8/2021 | Lu | ...................... | H03M 13/1111 |
| 11,146,290 B1 * | 10/2021 | Xiong | ................ | H03M 13/1111 |
| 2007/0011586 A1 * | 1/2007 | Belogolovyi | ...... | H03M 13/1111 |
| | | | | 714/774 |
| 2017/0238255 A1 * | 8/2017 | Chari | .................... | H04L 1/0053 |
| | | | | 455/574 |
| 2017/0257121 A1 | 9/2017 | Kwok | | |
| 2018/0175889 A1 * | 6/2018 | Bazarsky | .......... | H03M 13/6325 |
| 2020/0052716 A1 * | 2/2020 | Kim | ................... | H03M 13/1111 |
| 2020/0304155 A1 * | 9/2020 | Jeong | ................ | H03M 13/3753 |
| 2020/0341829 A1 * | 10/2020 | Kang | .................... | G06F 11/076 |
| 2020/0389186 A1 * | 12/2020 | Kim | ................... | H03M 13/1171 |
| 2021/0143837 A1 | 5/2021 | Asadi et al. | | |
| 2021/0218421 A1 * | 7/2021 | Fainzilber | ......... | H03M 13/3715 |
| 2021/0281278 A1 | 9/2021 | Lu et al. | | |
| 2022/0075686 A1 * | 3/2022 | Kumano | ............. | G11C 11/5642 |
| 2023/0094363 A1 * | 3/2023 | Graumann | ......... | H03M 13/1111 |
| | | | | 714/758 |

(Continued)

FOREIGN PATENT DOCUMENTS

KR 10-2020-0139571 A 12/2020

*Primary Examiner* — Albert Decady
*Assistant Examiner* — Osman M Alshack
(74) *Attorney, Agent, or Firm* — Haley Guiliano LLP

(57) ABSTRACT

Systems and methods for operating a low-density parity-check (LDPC) bit-flipping decoder are disclosed herein. An LDPC codeword is received, and each bit in the LDPC codeword is classified as either a high-confidence bit or a low-confidence bit based on at least one criterion. The LDPC codeword is iteratively processed over a plurality of iterations based on parity check equations associated with each bit of the LDPC codeword to generate a processed LDPC codeword. For each iteration of the plurality of iterations, the iterative processing includes flipping at least one bit of the LDPC codeword, while preventing, for a first n number of the plurality of iterations, bits classified as high-confidence bits from comprising more than 33% of the total number of flipped bits. The processed LDPC codeword is decoded.

20 Claims, 4 Drawing Sheets

(56) References Cited

U.S. PATENT DOCUMENTS

2024/0223213 A1* 7/2024 Kwok ................ H03M 13/1108

* cited by examiner

SYSTEMS AND METHODS FOR OPERATING LOW-DENSITY PARITY-CHECK BIT-FLIPPING DECODER

TECHNICAL FIELD

The present disclosure is related to a low-density parity-check (LDPC) bit-flipping decoder, and, more particularly, to improved systems and methods for operating an LDPC bit-flipping decoder to correct bit errors in an LDPC codeword.

SUMMARY

In accordance with the present disclosure, a method of operating an LDPC bit-flipping decoder to correct bit errors in an LDPC codeword using bit reliability information (e.g., soft reliability information) is provided. The method includes receiving an LDPC codeword, classifying each bit in the LDPC codeword as either a high-confidence bit or a low-confidence bit based on at least one criterion, and iteratively processing the LDPC codeword over a plurality of iterations based on parity check equations associated with each bit of the LDPC codeword to generate a processed LDPC codeword. For each iteration of the plurality of iterations, the iterative processing includes flipping at least one bit of the LDPC codeword, while preventing, for a first n number of the plurality of iterations, bits classified as high-confidence bits from including more than 33% of the total number of flipped bits. The method further includes decoding the processed LDPC codeword.

In some embodiments, the first n number of iterations may be equal to six.

In some embodiments, the at least one criterion may include soft reliability information that indicates the likelihood that a bit value of each bit in the LDPC codeword is correct.

In some embodiments, the soft reliability information may be obtained by performing a NAND soft bit read of storage cells storing the LDPC codeword.

In some embodiments, the iterative processing may include storing bits of the LDPC codeword in a buffer for use of each bit of the LDPC codeword as a separate variable node for implementing a bit-flipping algorithm, and for each iteration of the plurality of iterations, determining whether one or more check nodes coupled with the separate variable nodes are unsatisfied based on separate parity check equations for the one or more check nodes calculated during the iteration, in response to determining that one or more check nodes are unsatisfied, identifying a bit to flip among the stored bits of the LDPC codeword, and flipping the identified bit unless the current iteration is less than or equal to the n number of iterations and the identified bit is a high-confidence bit and flipping the bit would result in bits classified as high-confidence bits including more than 33% of the total number of flipped bits.

In some embodiments, decoding the processed LDPC codeword may include determining that all check nodes coupled to the separate variable nodes are satisfied.

In some embodiments, identifying the bit to flip among the stored bits of the LDPC codeword may include determining that more than half of the check nodes coupled to the variable node storing the bit are unsatisfied.

In some embodiments, receiving the LDPC codeword may include receiving the LDPC codeword from a NAND flash memory.

In some embodiments, the method may further include obtaining an initial syndrome of the LDPC codeword and setting the n number of iterations based on the obtained initial syndrome.

In some embodiments, an error correction control (ECC) decoder is provided. The ECC decoder includes a buffer and circuitry. The circuitry is configured to receive an LDPC codeword, classify each bit in the LDPC codeword as either a high-confidence bit or a low-confidence bit based on at least one criterion, and iteratively process the LDPC codeword over a plurality of iterations based on parity check equations associated with each bit of the LDPC codeword to generate a processed LDPC codeword. For each iteration of the plurality of iterations, the circuitry is configured to iteratively process the LDPC codeword by flipping at least one bit of the LDPC codeword, while preventing, for a first n number of the plurality of iterations, bits classified as high-confidence bits from including more than 33% of the total number of flipped bits. The circuitry is further configured to decode the processed LDPC codeword.

In some embodiments, a non-transitory, computer-readable medium having instructions encoded thereon is provided. The instructions, when executed by circuitry, cause the circuitry to receive an LDPC codeword, classify each bit in the LDPC codeword as either a high-confidence bit or a low-confidence bit based on at least one criterion, and iteratively process the LDPC codeword over a plurality of iterations based on parity check equations associated with each bit of the LDPC codeword to generate a processed LDPC codeword. For each iteration of the plurality of iterations, the instructions cause the circuitry to iteratively process the LDPC codeword by flipping at least one bit of the LDPC codeword, while preventing, for a first n number of the plurality of iterations, bits classified as high-confidence bits from including more than 33% of the total number of flipped bits. The instructions further cause the circuitry to decode the processed LDPC codeword.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, and/or characteristic included in at least one implementation. Thus, phrases such as "in one embodiment" or "in an alternate embodiment" appearing herein describe various embodiments and implementations, and do not necessarily all refer to the same embodiment. However, they are also not necessarily mutually exclusive.

DETAILED DESCRIPTION

Error correction codes (ECCs) may be used to protect data or recover from errors related to a medium (e.g., flash memory) in which the data was stored. ECC encoded data that is read from a storage device (e.g., a NAND solid state drive) may be able to identify and correct a number of such errors. In one example, ECC encoded data may include codewords, which include a combination of data and parity data (e.g., parity bits). Errors in retrieved codewords may be referred to as a raw bit error rate (RBER). In order to reduce the impacts of higher RBERs (e.g., based on increasing densities of storage devices), additional spare bytes may be added to data (e.g., for NAND flash memory) or data may be encoded into increasingly larger codewords, which include a larger amount of parity bytes. However, as the number of spare bytes that are added increases or as the size of the codewords increases, the complexity of algorithms to decode the codewords also increases.

In one example, data is encoded using an LDPC code (e.g., an LDPC codeword). Although LDPC codewords may provide relatively high levels of error correction capabilities when decoded by decoders that implement algorithms such as a sum-product algorithm (SPA) or a min-sum (MS) algorithm, SPA or MS decoders require a large amount of circuitry (e.g., millions of gates) to maintain throughput when decoding LDPC codewords. Thus, in one example, it may be advantageous to use a smaller and less complex LDPC bit-flipping decoder implementing a bit-flipping algorithm. However, the lower error correction-correction capabilities of LDPC bit-flipping decoders implementing bit-flipping algorithms may result in a high uncorrectable bit error rate (UBER) or may reduce the useful life of storage devices storing the LDPC codewords (e.g., based on RBER requirements).

In accordance with the present disclosure, improved systems and methods for operating an LDPC bit-flipping decoder to correct bit errors in an LDPC codeword using soft reliability information are provided.

The subject matter of this disclosure may be better understood by reference to FIGS. 1-4.

Figure 1:
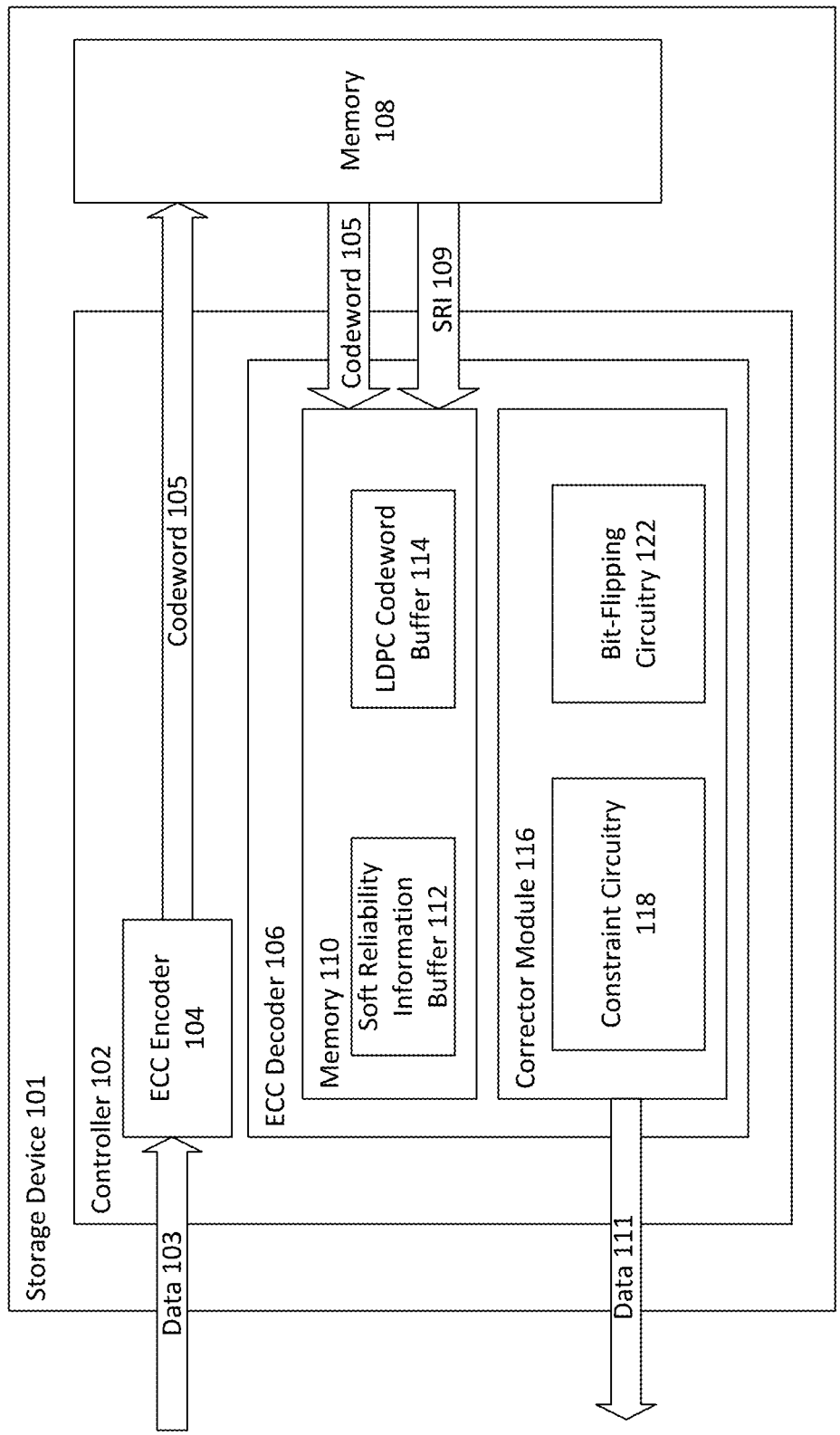
FIG. 1 shows an illustrative block diagram of a storage device, in accordance with some embodiments of the present disclosure.

FIG. 1 shows an illustrative block diagram of a storage device 101, in accordance with some embodiments of the present disclosure. As shown, storage device 101 may include controller 102 and memory 108. Controller 102 may include ECC encoder 104 to generate codewords to store in memory 108 and ECC decoder 106 to correct errors included in ECC encoded data using a bit-flipping algorithm. In some embodiments, controller 102 may include circuitry, including memory and one or more processors configured to execute instructions stored in the memory (e.g., a non-transitory, computer-readable medium) to perform the functions described herein (e.g., to implement ECC encoder 104 and ECC decoder 106). In some embodiments, the circuitry may include one or more application-specific integrated circuits (ASICs) or field programmable gate arrays (FPGAs). In one embodiment, storage device 101 may be a NAND solid state drive (SSD), and memory 108 may comprise NAND flash memory. However, this is only one example and memory 108 may comprise any suitable type of non-volatile or volatile memory such as random-access memory (RAM), dynamic RAM (DRAM), double data rate synchronous dynamic RAM (DDR SDRAM), static random-access memory (SRAM), thyristor RAM (T-RAM) or zero-capacitor RAM (Z-RAM), multi-threshold level NAND flash memory, NOR flash memory, etc.

ECC encoder 104 (e.g., an LDPC encoder) may encode data 103 (e.g., corresponding to a write request) using an LDPC code. The resulting LDPC codeword 105 may then be stored in memory 108. Thereafter, the stored LDPC codeword 105 may be read from memory 108 (e.g., corresponding to a read request). However, because the retrieved LDPC codeword 105 may include errors, the retrieved LDPC codeword 105 may be forwarded to memory 110 of ECC decoder 106 (e.g., an LDPC decoder) and stored in LDPC codeword buffer 114. ECC decoder 106 may also retrieve bit reliability information (e.g., soft reliability information 109), indicating the reliability of bits in the retrieved LDPC codeword 105, as explained in greater detail below with reference to FIG. 2. Soft reliability information 109 may be stored in soft reliability information buffer 112. In some embodiments, memory 110 may include volatile types of memory, such as SRAM.

Corrector module 116 of ECC decoder 106 may decode the retrieved LDPC codeword 105 stored in LDPC codeword buffer 114. For example, constraint circuitry 118 may implement a bit-flipping algorithm that uses soft reliability information 109 stored in soft reliability information buffer 112 to selectively flip bits of the retrieved LDPC codeword 105 to identify and attempt to correct any errors to successfully decode the retrieved LDPC codeword 105, as explained in greater detail below. In some embodiments, a working copy of the retrieved LDPC codeword 105 may be stored in a separate buffer. After ECC decoder 106 successfully decodes the retrieved LDPC codeword 105, ECC decoder 106 may output the decoded data 111 (e.g., to a device requesting the data).

Figure 2:
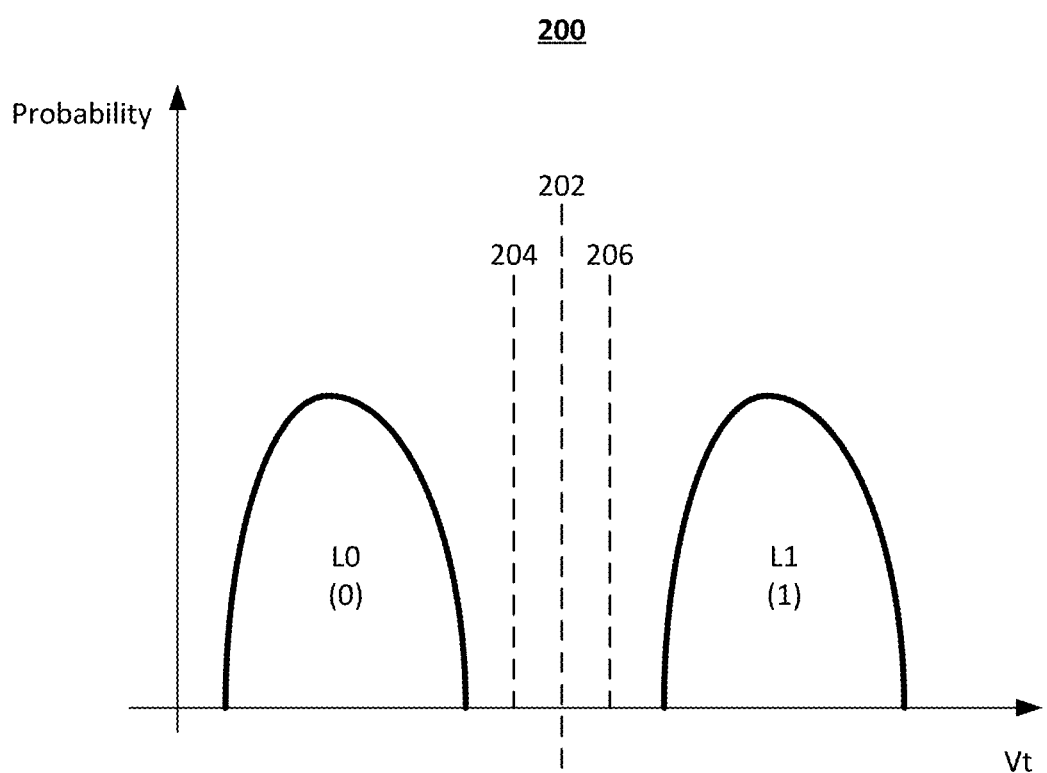
FIG. 2 illustrates an example of threshold voltage probability distributions for a storage cell of a memory of FIG. 1, in accordance with some embodiments of the present disclosure.

FIG. 2 illustrates an example of threshold voltage probability distributions 200 for a storage cell of memory 108 of FIG. 1, in accordance with some embodiments of the present disclosure. As shown, the x-axis represents threshold voltage ($V_t$) and the y-axis represents probability. In some embodiments, memory 108 of FIG. 1 may be a NAND flash memory. Although a single-level cell (SLC) is shown in FIG. 2, it should be understood that the NAND flash memory may have multi-level cells. When the NAND flash memory is read, a read reference voltage at an expected threshold $V_t$ between different levels of the storage cell may be applied to control gates of the storage cell. In one example, if current flows through the storage cell (e.g., transistor), the value stored in the storage cell is detected as a logic 1. Otherwise, if the current does not flow, the value stored in the storage cell is detected as a logic 0. In another example, logic 0 and logic 1 may be reversed.

However, threshold voltages are not always within expected distributions. In this case, some transistors may be on the wrong side of a read reference voltage, causing it to be read as a wrong logical bit value. For example, as shown, if either of L0 or L1 cross read voltage 202, the wrong logical bit value may be read. Accordingly, to obtain soft reliability information 109, a soft read of the storage cells where LDPC codeword 105 is stored may be performed by applying additional read voltages (e.g., read strobes) on either side of read voltage 202. For example, as shown, a 3-strobe read may be performed by also applying read voltages 204 and 206. The read reference voltages (e.g., 202, 204, and 206) can delineate "bins" or "zones" where the threshold voltage may lie (in the range below the lowest read reference voltage where a current flows through a transistor cell and above the highest read reference voltage where current did not flow through the transistor cell). For these bins, log-likelihood ratios (LLR) values can be assigned based on assumptions about normal Gaussian distributions expected based on test data. Based on the LLR values, bits can be classified as high-confidence bits (e.g., reliable bits) or low-confidence bits (e.g., unreliable bits). For example, in the illustrated example, "middle bins" of the 3-strobe read may be classified as low-confidence bits. However, this is only one example, and any suitable soft reads having any suitable number of strobe reads may be used by ECC decoder 106 to classify each bit of LDPC codeword 105 as a high-confidence bit or a low-confidence bit.

Figure 3:
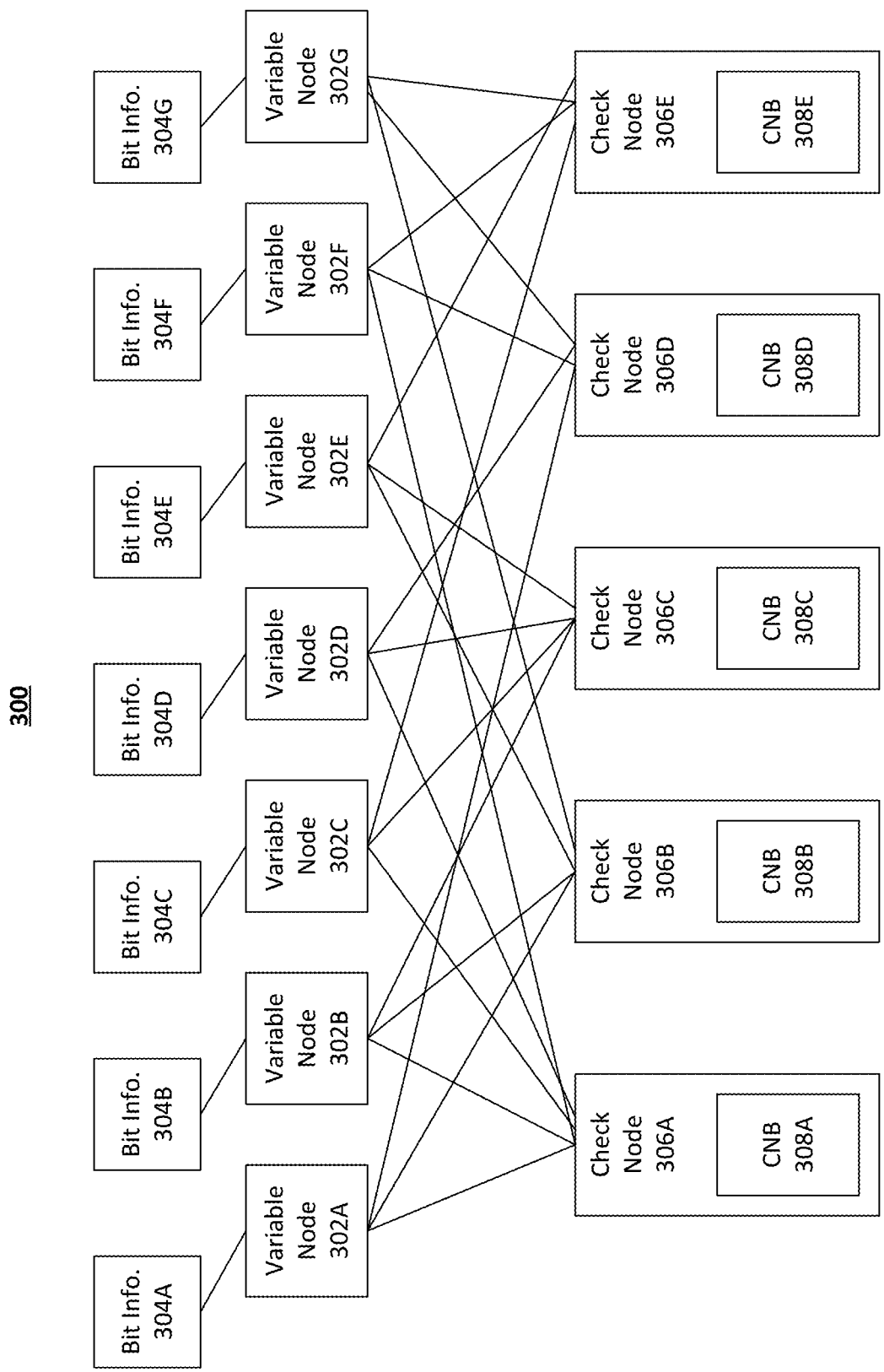
FIG. 3 shows an illustrative block diagram of a graph for implementing an iterative bit-flipping algorithm, in accordance with some embodiments of the present disclosure.

FIG. 3 shows an illustrative block diagram of a graph 300 for implementing an iterative bit-flipping algorithm, in accordance with some embodiments of the present disclosure. Graph 300 may be a modified version of a Tanner graph, which shows how LDPC codewords may be represented by variable nodes and check nodes. For example, as shown, the retrieved LDPC codeword 105 may be loaded into a plurality of variable nodes 302A-302G (collectively referred to as variable nodes 302). The seven variable nodes 302 may represent an LDPC codeword of seven bits retrieved from memory 108 during a read operation. Although a 7-bit LDPC codeword is discussed, it should be understood that much larger LDPC codewords may be decoded by ECC decoder 106 (e.g., 100-bit, to 140,000-bit LDPC codewords).

Bit information ("Info.") 304A-304G (collectively referred to as bit information 304) may include classification information for each bit (e.g., as a high-confidence bit or a low-confidence bit) determined from soft reliability information 109. Check nodes 306A-306E (collectively referred to as check nodes 306) may represent one or more parity check equations. As shown, each individual check node 306 may include a check node bit (CNB) 308A-308E for maintaining check node information of the node. During operation, if the one or more parity check equations associated with a check node 306 fail or are unsatisfied, then the CNB 308 of the check node 306 may be assigned a binary value of one. In some examples, ECC decoder 106 implementing a bit-flipping algorithm may use an iterative decoding scheme for the 7-bit LDPC codeword shown in graph 300. In some embodiments, the original input of each of the seven variable nodes 302 may be stored so that if the variable node 302 is flipped, a copy of the original input value may be retained.

Figure 4:
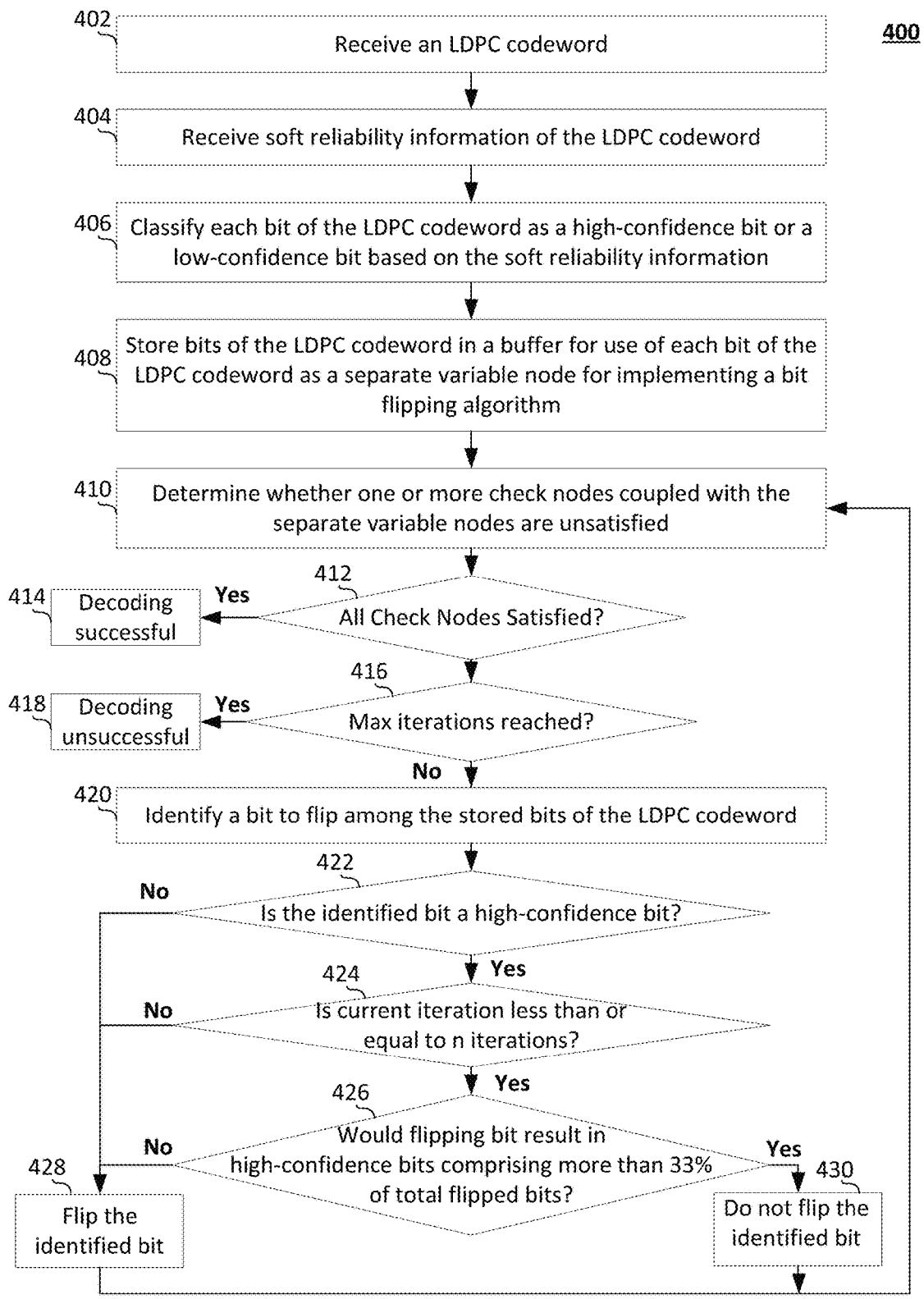
FIG. 4 depicts an illustrative flowchart of a control process of decoding an LDPC codeword, in accordance with some embodiments of the present disclosure.

FIG. 4 depicts an illustrative flowchart 400 of a control process of decoding an LDPC codeword, in accordance with some embodiments of the present disclosure. In some embodiments, the LDPC codeword may be the 7-bit LDPC codeword represented by graph 300 of FIG. 3, while implementing a bit-flipping algorithm and using soft reliability information. For convenience of description, elements of ECC decoder 106 of FIG. 1 and graph 300 of FIG. 3 may be used to describe various portions of the control process.

At 402, ECC decoder 106 receives an LDPC codeword. For example, ECC decoder 106 may retrieve LDPC codeword 105 from memory 108 (e.g., in response to receiving a read request).

At 404, ECC decoder 106 receives soft reliability information of LDPC codeword 105. In some embodiments, the soft reliability information (e.g., soft reliability information 109) may be obtained by performing a NAND soft bit read of the storage cells of memory 108 storing LDPC codeword 105. In some embodiments, the soft bit read may be a 3-strobe read, a 5-strobe read, or a 7-strobe read (e.g., based on decoding requirements for the LDPC codeword).

At 406, ECC decoder 106 may classify each bit of LDPC codeword 105 as either a high-confidence bit or a low-confidence bit based on at least one criterion (e.g., soft reliability information 109). In one example, if a 3-strobe read is used, bits classified as "middle bits" (e.g., assigned to the inner two bins of the 3-strobe read) may be classified as low-confidence bits, while other bits (e.g., assigned to the outer bins of the 3-strobe read) may be classified as high-confidence bits. In some embodiments, 10% of bits from the soft bit read may be classified as low-confidence bits. However, it should be understood that any suitable method of classifying bits based on the soft reliability information may be used.

At 408, ECC decoder 106 stores bits of LDPC codeword 105 in a buffer (e.g., LDPC codeword buffer 114) for use of each bit of the LDPC codeword as a separate variable node for implementing a bit-flipping algorithm. For example, as shown in FIG. 3, each bit of LDPC codeword 105 may be stored in a variable node of variables nodes 302A-302G. Additionally, ECC decoder 106 may store bit information 304A-304G in a separate buffer respectively associated with variable nodes 302A-302G. The bit information 304 may include information indicating the classification of each of the bits (e.g., determined at 406).

At 410, ECC decoder 106 may determine whether one or more check nodes 306A-306E coupled with separate variable nodes 302 are unsatisfied based on separate parity check equations for the one or more check nodes 306 calculated during an iteration of a bit-flipping algorithm. In some embodiments, ECC decoder 106 may determine an initial syndrome of LDPC codeword 105 based on the initial number of check nodes 306 that are unsatisfied. As detailed above, CNB 308 of check nodes 306 having a binary value of 0 may indicate that a parity check equation of check node 306 is satisfied. Thus, at 412, constraint circuitry 118 may check CNB 308 to determine if all CNBs 308 have a binary value of 0 to determine whether all check nodes 306 are satisfied. If all check nodes 306 are satisfied ("Yes" at 412), the control process proceeds to 414, and the LDPC codeword is successfully decoded. After LDPC codeword 105 is successfully decoded, corrector module 116 may forward data encoded in LDPC codeword 105 (e.g., data 111) for delivery to the source of the request (e.g., the read request). Otherwise ("No" at 412), the control process proceeds to 416.

At 416, ECC decoder 106 determines if a maximum number of iterations of the bit-flipping algorithm have been reached. In some embodiments, the maximum number of bit-flipping iterations may be based on how many attempts (iterations) to correct LDPC codeword 105 can be made before deeming LDPC codeword 105 as having errors that are not correctable by the bit-flipping algorithm. In one embodiment, the maximum number of bit-flipping iterations is set to a fixed number (e.g., 30). In another embodiment, the maximum number of bit-flipping iterations is set based on the probability of correctly decoding the LDPC codeword (e.g., based on the number of unsatisfied check nodes 306 after n iterations). In response to determining that the maximum number of iterations has been reached ("Yes" at 416), the control process proceeds to 418. Otherwise ("No" at 416), the control process continues to 420.

At 418, if the maximum number of iterations has been reached without successful decoding LDPC codeword 105, corrector module 116 may indicate that decoding has failed (e.g., by sending an indication of the decoding failure to the source of the read request). In some embodiments, LDPC codeword 105 may be decoded by an SPA or MS decoder.

At 420, ECC decoder 106 may identify one or more bits to flip among bits of LDPC codeword 105. For example, constraint circuitry 118 may identify the one or more bits to flip based on the number of unsatisfied check nodes 306 coupled to each variable node 302. For example, any suitable bit-flipping algorithm may be used to identify whether a bit should be flipped. In some embodiments, a bit may be identified to be flipped if more than 50% of the check nodes 306 associated with the variable node 302 are unsatisfied. In some embodiments, additional information (e.g., whether a bit has been previously flipped) may be used to identify bits to be flipped.

At 422, ECC decoder 106 determines, for each of the one or more identified bits to be flipped, if the identified bit to be flipped is a high-confidence bit. For example, constraint circuitry 118 may check bit information 304 associated with each of the identified bits. For convenience in description, a single identified bit to be flipped is described herein in the control process; however, it should be understood that more than one bit may be identified to be flipped during each iteration of the bit-flipping algorithm. In response to determining that the identified bit is not a high-confidence bit ("No" at 422), the control process proceeds to 428. Otherwise ("Yes" at 422), the control process proceeds to 424.

At 424, ECC decoder 106 determines if the current iteration of the iterative bit-flipping algorithm is less than or equal to n iterations. In some embodiments, n may be equal to 6. However, this is only one example, and n may be set to any suitable number. For example, n may be adjusted based on the initial syndrome weight value (e.g., n may be set to a smaller value for lower syndrome weight values or to a larger value for higher syndrome weight values). That is, as the number of unsatisfied check nodes 306 decreases, the value of n may also decrease. By preventing certain high-confidence bits from being flipped during the first n iterations based on soft reliability information according to the control process, UBER of ECC decoder 106 may be improved. In response to determining that the current iteration of the bit-flipping algorithm is less than or equal to n iterations ("Yes" at 424), the control process proceeds to 426. Otherwise ("No" at 424), the control process proceeds to 428.

At 426, ECC decoder 106 determines if flipping the identified bit would result in high-confidence bits comprising more than 33% of the total flipped bits (e.g., a threshold flip percentage). For example, as bits are flipped, constraint circuitry 118 may track the ratio of the number of high-confidence bits that have been flipped with the total number of bits that have been flipped (e.g., across all iterations of the bit-flipping algorithm). In response to determining that flipping the bit would result in high-confidence bits comprising more than 33% of the total number of flipped bits ("Yes" at 426), the control process may proceed to 430. Otherwise ("No" at 426), the control process may proceed to 428.

In some embodiments, the threshold flip percentage for determining whether a bit should be flipped may be set to a value between 0% (e.g., not allowing any high-confidence bits from being flipped during the first n iterations of the bit-flipping algorithm and 33% (e.g., limiting the flips of high-confidence bits to less than 33% of the total number of bits flipped). In some embodiments, the threshold flip percentage may be set based on characteristics of one or more LDPC codes being decoded by ECC decoder 106, the syndrome weight of the LDPC codeword, or RBER. In one example, the threshold flip percentage may be set to 10%. However, this is only an example, and the threshold flip percentage may be set to any suitable percentage within the range of 0-33%, based on characteristics of one or more LDPC codewords being decoded by EEC decoder 106, the syndrome weight of the LDPC codeword, RBER, etc.

In some embodiments, ECC decoder 106 may prevent any high-confidence bits from being flipped during the first n iterations of the bit-flipping algorithm, unless the variable node 302 associated with the identified high-confidence bit is connected to a very large number of unsatisfied check nodes 306 (e.g., indicating with a high probability that the bit should be flipped). In some embodiments, if the initial syndrome weight is low (e.g., there is a very small number of unsatisfied check nodes 306), ECC decoder 106 allows an identified high-confidence bit to be flipped. For example, ECC decoder 106 may exclude the bit information 304 associated with the bit. In some embodiments, bit values of erased bits that are flipped may not count towards the total number of flipped bits.

At 428, ECC decoder 106 may flip the identified bit. For example, constraint circuitry 118 may cause bit-flipping circuitry 122 to flip respective bits of variable node 302 of the identified bit (e.g., from a binary value of 1 to a binary value of 0). The control process then returns to 410 to perform the next iteration of the bit-flipping algorithm to generate the processed LDPC codeword that is able to be decoded At 430, ECC decoder 106 may prevent the identified bit from being flipped. For example, constraint circuitry 118 does not cause bit-flipping circuitry 122 to flip respective bits of variable node 302 of the identified bit. The control process then returns to 410 to perform the next iteration of the bit-flipping algorithm to generate the processed LDPC codeword that is able to be decoded.

The processes discussed above are intended to be illustrative and not limiting. One skilled in the art would appreciate that the steps of the processes discussed herein may be omitted, modified, combined and/or rearranged, and any additional steps may be performed without departing from the scope of the invention.

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. A method comprising:
receiving a low-density parity-check (LDPC) codeword;
classifying each bit in the LDPC codeword as either a high-confidence bit or a low-confidence bit based on at least one criterion;
iteratively processing the LDPC codeword over a plurality of iterations based on parity check equations associated with each bit of the LDPC codeword to generate a processed LDPC codeword, wherein for each iteration of the plurality of iterations, the iterative processing comprises flipping at least one bit of the LDPC codeword, while preventing, for a first n number of the plurality of iterations, bits classified as high-confidence bits from comprising more than 33% of the total number of flipped bits; and
decoding the processed LDPC codeword.

2. The method of claim 1, wherein the first n number of iterations is equal to six.

3. The method of claim 1, wherein the at least one criterion is soft reliability information that indicates the likelihood that a bit value of each bit in the LDPC codeword is correct.

4. The method of claim 3, wherein the soft reliability information is obtained by performing a NAND soft bit read of storage cells storing the LDPC codeword.

5. The method of claim 1, wherein the iterative processing comprises:
   storing bits of the LDPC codeword in a buffer for use of each bit of the LDPC codeword as a separate variable node for implementing a bit-flipping algorithm; and
   for each iteration of the plurality of iterations:
      determining whether one or more check nodes coupled with the separate variable nodes are unsatisfied based on separate parity check equations for the one or more check nodes calculated during the iteration;
      in response to determining that one or more check nodes are unsatisfied, identifying a bit to flip among the stored bits of the LDPC codeword; and
      flipping the identified bit unless:
         the current iteration is less than or equal to the n number of iterations; and
         the identified bit is a high-confidence bit and flipping the bit would result in bits classified as high-confidence bits comprising more than 33% of the total number of flipped bits.

6. The method of claim 5, wherein decoding the processed LDPC codeword comprises determining that all check nodes coupled to the separate variable nodes are satisfied.

7. The method of claim 5, wherein identifying the bit to flip among the stored bits of the LDPC codeword comprises determining that more than half of the check nodes coupled to the variable node storing the bit are unsatisfied.

8. The method of claim 1, wherein receiving the LDPC codeword comprises receiving the LDPC codeword from a NAND flash memory.

9. The method of claim 1, further comprising:
   obtaining an initial syndrome of the LDPC codeword; and
   setting the n number of iterations based on the obtained initial syndrome.

10. An error correction control (ECC) decoder comprising:
   a buffer; and
   circuitry configured to:
      receive a low-density parity-check (LDPC) codeword;
      classify each bit in the LDPC codeword as either a high-confidence bit or a low-confidence bit based on at least one criterion;
      iteratively process the LDPC codeword over a plurality of iterations based on parity check equations associated with each bit of the LDPC codeword to generate a processed LDPC codeword, wherein for each iteration of the plurality of iterations, the circuitry is configured to iteratively process the LDPC codeword by flipping at least one bit of the LDPC codeword, while preventing, for a first n number of the plurality of iterations, bits classified as high-confidence bits from comprising more than 33% of the total number of flipped bits; and
      decode the processed LDPC codeword.

11. The ECC decoder of claim 10, wherein the first n number of iterations is equal to six.

12. The ECC decoder of claim 10, wherein the at least one criterion is soft reliability information that indicates the likelihood that a bit value of each bit in the LDPC codeword is correct.

13. The ECC decoder of claim 12, wherein the soft reliability information is obtained by performing a NAND soft bit read of storage cells storing the LDPC codeword.

14. The ECC decoder of claim 10, wherein the circuitry is configured to iteratively process the LDPC codeword by:
   storing bits of the LDPC codeword in the buffer for use of each bit of the LDPC codeword as a separate variable node for implementing a bit-flipping algorithm; and
   for each iteration of the plurality of iterations:
      determining whether one or more check nodes coupled with the separate variable nodes are unsatisfied based on separate parity check equations for the one or more check nodes calculated during the iteration;
      in response to determining that one or more check nodes are unsatisfied, identifying a bit to flip among the stored bits of the LDPC codeword; and
      flipping the identified bit unless:
         the current iteration is less than or equal to the n number of iterations; and
         the identified bit is a high-confidence bit and flipping the bit would result in bits classified as high-confidence bits comprising more than 33% of the total number of flipped bits.

15. The ECC decoder of claim 14, wherein the circuitry is configured to decode the processed LDPC codeword by determining that all check nodes coupled to the separate variable nodes are satisfied.

16. The ECC decoder of claim 14, wherein the circuitry is configured to identify the bit to flip among the stored bits of the LDPC codeword by determining that more than half of the check nodes coupled to the variable node storing the bit are unsatisfied.

17. The ECC decoder of claim 10, wherein the circuitry is configured to receive the LDPC codeword by receiving the LDPC codeword from a NAND flash memory.

18. A non-transitory, computer-readable medium having instructions encoded thereon that when executed by circuitry cause the circuitry to:
   receive a low-density parity-check (LDPC) codeword;
   classify each bit in the LDPC codeword as either a high-confidence bit or a low-confidence bit based on at least one criterion;
   iteratively process the LDPC codeword over a plurality of iterations based on parity check equations associated with each bit of the LDPC codeword to generate a processed LDPC codeword, wherein for each iteration of the plurality of iterations, the instructions cause the circuitry to iteratively process the LDPC codeword by flipping at least one bit of the LDPC codeword, while preventing, for a first n number of the plurality of iterations, bits classified as high-confidence bits from comprising more than 33% of the total number of flipped bits; and
   decode the processed LDPC codeword.

19. The non-transitory computer readable medium of claim 18, wherein the first n number of iterations is equal to six.

20. The non-transitory computer readable medium of claim 18, wherein the at least one criterion is soft reliability information that indicates the likelihood that a bit value of each bit in the LDPC codeword is correct.

* * * * *